(12) United States Patent
Herner et al.

(10) Patent No.: US 7,754,605 B2
(45) Date of Patent: Jul. 13, 2010

(54) ULTRASHALLOW SEMICONDUCTOR CONTACT BY OUTDIFFUSION FROM A SOLID SOURCE

(75) Inventors: S. Brad Herner, San Jose, CA (US); Steven J Radigan, Fremont, CA (US)

(73) Assignee: SanDisk 3D LLC, Milpitas, CA (US)

( * ) Notice: Subject to any disclaimer, the term of this patent is extended or adjusted under 35 U.S.C. 154(b) by 803 days.

(21) Appl. No.: 11/478,706

(22) Filed: Jun. 30, 2006

(65) Prior Publication Data

US 2008/0003793 A1    Jan. 3, 2008

(51) Int. Cl.
*H01L 21/443* (2006.01)
(52) U.S. Cl. ............... 438/656; 438/657; 438/672; 257/E21.146
(58) Field of Classification Search ......... 438/657, 438/684; 257/E21.146
See application file for complete search history.

(56) References Cited

U.S. PATENT DOCUMENTS

| | | | |
|---|---|---|---|
| 4,692,348 A | | 9/1987 | Rubloff et al. |
| 4,829,024 A | * | 5/1989 | Klein et al. ............ 438/14 |
| 5,217,924 A | | 6/1993 | Rodder et al. |
| 5,915,167 A | | 6/1999 | Leedy |
| 6,479,340 B1 | * | 11/2002 | Agarwal ............ 438/238 |
| 6,952,030 B2 | | 10/2005 | Herner et al. |
| 7,172,840 B2 | | 2/2007 | Chen |
| 7,307,013 B2 | | 12/2007 | Raghuram |
| 2004/0217457 A1 | | 11/2004 | Sudarshan et al. |
| 2005/0052915 A1 | * | 3/2005 | Herner et al. ............ 365/202 |
| 2005/0221200 A1 | | 10/2005 | Chen |
| 2005/0226067 A1 | | 10/2005 | Herner et al. |
| 2006/0273298 A1 | * | 12/2006 | Petti ............ 257/5 |
| 2007/0284656 A1 | | 12/2007 | Radigan et al. |

FOREIGN PATENT DOCUMENTS

JP          02172218 A          7/1990

OTHER PUBLICATIONS

International Search Report and Written Opinion of International Application No. PCT/US2007/015321 (SD-MXA-174-PCT) mailed Mar. 20, 2008.
Herner et al. "Vertical p-i-n Polysilicon Diode With Antifuse for Stackable Field-Programmable ROM" IEEE Electron Device Letters, IEEE Service Center, NY, NY US, vol. 25, No. 5, May 2004, pp. 271-273.

* cited by examiner

*Primary Examiner*—Stephen W Smoot
(74) *Attorney, Agent, or Firm*—Dugan & Dugan, PC

(57) ABSTRACT

The surface of a conductive layer such as a conductive nitride, a conductive silicide, a metal, or metal alloy or compound, is exposed to a dopant gas which provides an n-type or p-type dopant. The dopant gas may be included in a plasma. Semiconductor material, such as silicon, germanium, or their alloys, is deposited directly on the surface which has been exposed to the dopant gas. During and subsequent to deposition, dopant atoms diffuse into the deposited semiconductor, forming a thin heavily doped region and making a good ohmic contact between the semiconductor material and the underlying conductive layer.

49 Claims, 5 Drawing Sheets

US 7,754,605 B2

ULTRASHALLOW SEMICONDUCTOR CONTACT BY OUTDIFFUSION FROM A SOLID SOURCE

BACKGROUND OF THE INVENTION

The invention relates to a method to form a very thin doped region in semiconductor material deposited on a conductor, forming an ohmic contact between the semiconductor material and the underlying conductor.

Because of unwanted dopant diffusion, it can be difficult to form a very thin in situ doped region in deposited silicon, particularly using typical n-type dopants, which tend to diffuse during deposition.

There is a need, therefore, for a method to form a good contact between deposited semiconductor material and underlying conductive material.

SUMMARY OF THE PREFERRED EMBODIMENTS

The present invention is defined by the following claims, and nothing in this section should be taken as a limitation on those claims. In general, the invention is directed to a method to form electrical contact between deposited semiconductor material and an underlying conductor.

A first aspect of the invention provides for a method for forming a contact to semiconductor material, the method comprising: either a) flowing a dopant gas over an exposed surface of a first conductive layer or b) exposing the first conductive layer to a plasma containing the dopant gas, wherein the dopant gas provides an n-type or p-type dopant; and depositing the semiconductor material immediately on the surface of the first conductive layer, wherein the semiconductor material and the first conductive layer form a portion of an integrated circuit, and wherein the n-type or p-type dopant forms a substantially ohmic contact between the semiconductor material and the first conductive layer.

Another aspect of the invention provides for a method for forming a memory cell, the method comprising: forming a first conductor, the first conductor comprising a first conductive layer; either a) flowing a dopant gas over an exposed first surface of the first conductive layer or b) exposing the exposed first surface of the first conductive layer to a plasma containing a dopant gas, wherein the dopant gas provides an n-type or p-type dopant; depositing a layer of semiconductor material directly on the first surface; patterning and etching the layer of semiconductor material to form a pillar; and forming a second conductor, the second conductor above the pillar, wherein the memory cell comprises a portion of the first conductor, the pillar, and a portion of the second conductor, wherein some of the n-type or p-type dopant diffuses into the layer of semiconductor material, forming a substantially ohmic contact between the semiconductor material and the first conductor.

A preferred embodiment of the invention provides for a method for forming a monolithic three dimensional memory array, the method comprising: a) monolithically forming a first memory level above a substrate, the first memory level comprising a plurality of first memory cells, the first memory level formed by a method comprising: i) forming a plurality of bottom conductors, each bottom conductor comprising a first conductive layer; ii) flowing a dopant gas over an exposed first surface of the first conductive layer, or exposing the first surface of the first conductive layer to a dopant gas, the dopant gas providing an n-type or p-type dopant; iii) depositing a layer of semiconductor material directly on the first surface; iv) patterning and etching the layer of semiconductor material to form a first plurality of pillars; and v) forming a plurality of second conductors, the second conductors above the first pillars, wherein the memory cell comprises a portion of the first conductor, the first pillar, and a portion of the second conductor; and b) monolithically forming a second memory level above the first memory level.

Each of the aspects and embodiments of the invention described herein can be used alone or in combination with one another.

The preferred aspects and embodiments will now be described with reference to the attached drawings.

DETAILED DESCRIPTION OF THE PREFERRED EMBODIMENTS

Figure 1:
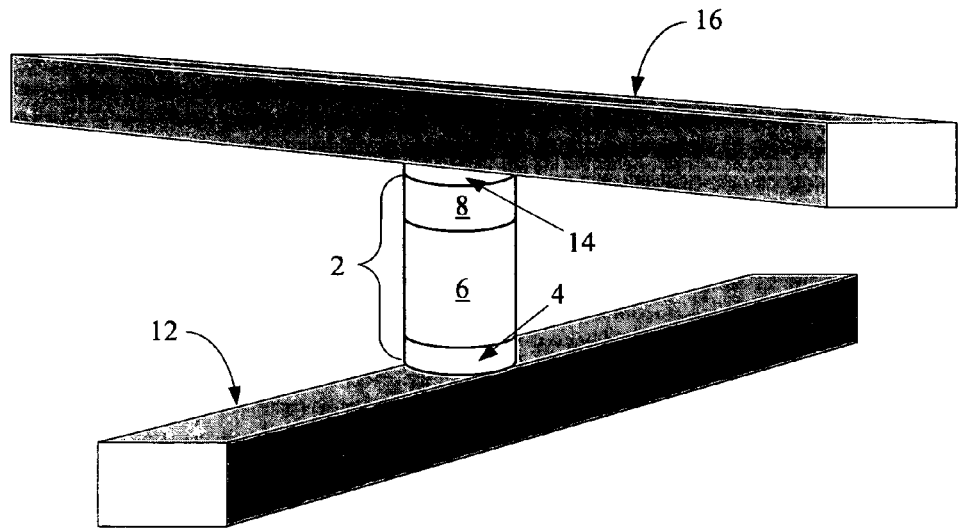
FIG. 1 is a perspective view of a memory cell that can be formed using methods of the present invention.

FIG. 1 shows a memory cell like those described in Hemer et al., U.S. Pat. No. 6,952,030, "High-Density Three-Dimensional Memory Cell," hereinafter the '030 patent; and in Hemer et al., U.S. patent application Ser. No. 10/955,549, "Nonvolatile Memory Cell Without a Dielectric Antifuse Having High- and Low-Impedance States," filed Sep. 29, 2004, hereinafter the '549 application, both assigned to the assignee of the present invention and hereby incorporated by reference.

In the cell of FIG. 1, a bottom conductor 12 is formed of a conductive material and extends in a first direction. Barrier and adhesion layers may be included in bottom conductor 12. Polycrystalline semiconductor diode 2 has a bottom heavily doped n-type region 4; an intrinsic region 6, which is not intentionally doped; and a top heavily doped p-type region 8, though the polarity of this diode may be reversed. Such a diode will be referred to as a p-i-n diode. Dielectric rupture antifuse 14 is included in some embodiments. Top conductor 16 may be formed in the same manner and of the same materials as bottom conductor 12, and extends in a second direction different from the first direction. Polycrystalline semiconductor diode 2 is vertically disposed between bottom conductor 12 and top conductor 16, and the memory cell comprises a portion of bottom conductor 12, a portion of top conductor 16, and the pillar which includes diode 2 and antifuse 14. This memory cell can be formed above a suitable substrate, for example above a monocrystalline silicon wafer.

In its initial state, dielectric rupture antifuse is intact, and impedes current flow. In addition, as described in the '549 application and in Hemer et al., U.S. patent application Ser. No. 11/148,530, "Nonvolatile Memory Cell Operating by Increasing Order in Polycrystalline Semiconductor Material," filed Jun. 8, 2005, hereinafter the '530 assigned to the assignee of the present invention and hereby incorporated by reference, in preferred embodiments the semiconductor material of the diode 2 is formed in a relatively high-resistivity state, further impeding current flow. When a read voltage is applied between top conductor 16 and bottom conductor 12, very little current flows between them. Upon application of a programming voltage, however, dielectric rupture antifuse 14 is ruptured and the semiconductor material of diode 2 is transformed to a lower-resistivity state, and a significantly larger current flows between top conductor 16 and bottom conductor 12 when a read voltage is applied. In this way a programmed cell can be distinguished from an unprogrammed cell.

In most embodiments, the diode 2 is formed of deposited polycrystalline silicon, or polysilicon, and bottom heavily doped n-type region 4 is doped in situ, by flowing a dopant gas, such as $PH_3$, that will provide an n-type dopant during silicon deposition. To deposit intrinsic region 6, the flow of the dopant gas is stopped while deposition of silicon continues. In general, deposited intrinsic silicon has defects which cause it to behave electrically as though lightly n-doped. In preferred embodiments, top heavily doped p-type region 8 is doped by ion implantation. Thus a p-n junction is formed between intrinsic region 6 and top heavily doped p-type region 8, while bottom heavily doped n-type region 4 provides a good ohmic contact to underlying conductor 12. An "ohmic contact" is a contact which is substantially symmetric, having a linear I-V characteristic in both biasing directions. An example of a non-ohmic contact is a p-n junction, which conducts more readily in one direction than in the opposite direction.

Figures 2A, 2B, 2C, 2D:
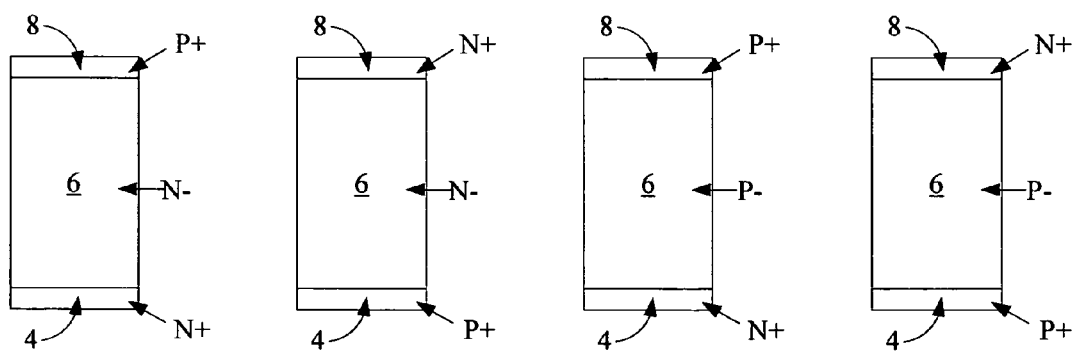
FIGS. 2a-2d are cross-sectional views illustrating different configurations of vertically oriented diodes having a bottom heavily doped region formed according to embodiments of the present invention.

Diode 2 could be formed in various different configurations. FIG. 2a shows diode 2 formed as in FIG. 1, with bottom region 4 heavily n-doped, intrinsic region 6 behaving as though lightly n-doped, and top region 8 heavily p-doped. FIG. 2b shows the same diode formed upside-down; intrinsic region 6 behaves as though lightly n-doped, bottom region 4 is heavily p-doped and top region 8 is heavily n-doped.

In FIGS. 2c and 2d, middle region 6 is lightly p-doped. In FIG. 2c, bottom region 4 is heavily n-doped and top region 8 is heavily p-doped, while in FIG. 2d, bottom region 4 is heavily p-doped and top region 8 is heavily n-doped. In all of these embodiments, bottom region 4 makes ohmic contact to an underlying layer. In the diodes of FIGS. 2b and 2c, the p-n junction is formed between bottom region 4 and middle region 6.

A diode is characterized by asymmetrical conduction characteristics; it conducts current more readily in one direction than in the opposite direction. When subjected to forward bias above its turn-on voltage, a significant current flows through a diode, while the same diode, when biased in reverse, preferably allows little or no current flow. The current that flows through a diode under reverse bias is minimized by increasing the thickness of the intrinsic or lightly doped region (region 6 in FIGS. 1 and 2a-2d.)

It is disadvantageous, however, to simply increase the overall height of the diode. As the density of the memory increases, the patterned width of the pillars becomes smaller, and the gaps between them narrower, but the height of the pillar remains the same; thus the aspect ratio of both the pillars and intervening gaps increases. High-aspect ratio features can be difficult to etch without flaws like bridging defects, and high-aspect ratio gaps can be difficult to fill with no voids.

The thickness of intrinsic or lightly doped region 6 can be increased without increasing overall diode height by decreasing the thickness of bottom heavily doped region 4. By using methods of the present invention a very thin heavily doped region can be formed in deposited semiconductor material to form an ohmic contact to an underlying material. If the semiconductor material immediately above the heavily doped layer is of the opposite conductivity type, the methods of the present invention allow formation of a very shallow junction. The deposited semiconductor material can be, for example, silicon, germanium, or an alloy of silicon and/or germanium.

FIGS. 1 and 2a-2d have shown one device in which the methods of the present invention can be used to advantage, but it will be apparent to those skilled in the art that these methods can be useful in any device in which a thickness of deposited heavily doped semiconductor material is to make contact to an underlying conductor.

Figure 3A:
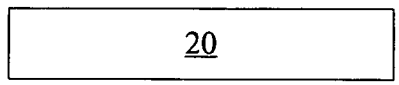
FIG. 3a-3c are cross-sectional views illustrating aspects of the present invention.

In methods of the present invention, turning to FIG. 3a, a layer 20 of a conductive material is formed. Layer 20 can be formed of any material appropriate to make a substantially ohmic contact to doped semiconductor material such as silicon, germanium, or their alloys, including conductive nitrides such as titanium nitride, tantalum nitride, tungsten nitride, nickel silicide, etc.; metal silicides such as cobalt silicide, titanium silicide, tungsten silicide, etc.; and metals and metal alloys and compounds such as tungsten, tantalum, titanium tungsten, etc.

The surface of conductive layer 20 is exposed to a dopant gas which will provide an n-type or p-type dopant. Appropriate n-type or p-type dopants include phosphorus, boron, arsenic, indium, gallium, or aluminum. Some dopant gases which may advantageously be used are, for example, $PH_3$, $POCl_3$, $BCl_3$, $B_2H_6$, $AsH_3$, $GaCl$, $GaCl_3$, $Ga(CH_3)_3$, $Al(CH_3)_3$, or $In(H_3)_3$. The dopant gas may be flowed over the exposed surface of layer 20, and may be diluted with an inert gas such as helium or nitrogen to improve mixing. Alternatively, the surface of layer 20 can be exposed to a plasma containing one of these dopant gases.

Figure 3B:
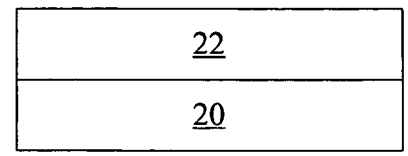
Figure 3C:
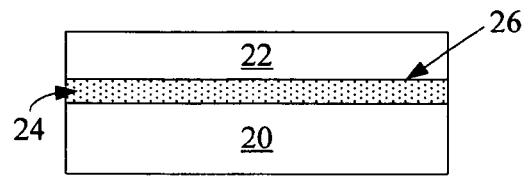

After layer 20 is exposed to the dopant gas, it is preferred to flow an inert gas for some period of time. For some furnaces, such as a relatively large low pressure chemical vapor deposition (LPCVD) furnace, this time period is preferably at least one minute, preferably two to ten minutes or more. In smaller single-wafer furnaces, a shorter purge time, for example about ten seconds, may be sufficient. Then, as in FIG. 3b, a layer of semiconductor material 22 is deposited directly on the surface of conductive layer 20. Semiconductor material 22 can be silicon, germanium, or any appropriate alloy of silicon and/or germanium, and is preferably undoped or very lightly doped. Preferably during this deposition, no dopant gas providing a p-type or n-type dopant is present. Depending on deposition temperature, semiconductor material 22 will be amorphous, microcrystalline, or polycrystalline. During and following deposition, some of the n-type or p-type dopant provided by the dopant gas in the previous step diffuses into semiconductor material 22, forming a thin heavily doped region 24 shown in FIG. 3c. Heavily doped region 24 forms an ohmic contact to underlying conductive layer 20. If the effective conductivity type of undoped or lightly doped region 22 is opposite that of heavily doped region 24, the boundary 26 between them is a p-n junction.

The steps of a) exposing the surface of conductive layer 20 to the dopant gas, or to a plasma containing the dopant gas, b) flushing the chamber with an inert gas, and c) depositing the semiconductor material 22 preferably are all performed in the same chamber, without removing the substrate from the chamber between steps.

The methods of the present invention provide particular advantage when the deposited material is silicon or a siliconrich alloy and the dopant is an n-type dopant such as phosphorus or arsenic. To dope silicon in situ, a dopant gas is flowed during deposition, providing phosphorus or arsenic which is incorporated into the silicon layer as it forms. To form an undoped region immediately above and in contact with the heavily doped region (such as region 6 above region 4 in FIG. 1), flow of the dopant gas is stopped while silicon deposition continues; ideally silicon deposited after this point is undoped. Both phosphorus and arsenic tend to exhibit surfactant behavior, however, and phosphorus or arsenic from the heavily doped region diffuses upward, seeking the surface, diffusing into the region which is intended to be undoped. As a result a significant thickness of silicon, for example as much as 800 to 1000 angstroms, must be formed with no phosphorus or arsenic provided before the dopant concentration is as low as desired, forming a heavily doped region that is thicker than intended. The methods of the present invention allow formation of a very thin heavily doped n-type region in deposited silicon to make ohmic contact to an underlying conductive layer.

Other attempts have been made to solve this problem; it is known to implant n-type or p-type dopants into a conductive layer adjacent to deposited semiconductor material, causing the dopants to diffuse into the semiconductor material. Typically, however, insufficient dopant concentration or activation has been achieved for anneal temperatures less than about 800 degrees C., forming a relatively poor contact. The very thin heavily doped region of the present invention forms a good ohmic contact without requiring a high-temperature anneal. (High temperature steps can cause many problems during device fabrication, such as peeling due to differential thermal expansion, unwanted dopant diffusion, etc., and should be minimized.) The good contact of the heavily doped region to the underlying conductive layer, and the fact that this region is very thin and thus the intrinsic region can be thicker without increasing the overall height of the diode, allow formation of a diode (as in FIG. 1) having high current flow under forward bias and low current flow under reverse bias.

Figure 4:
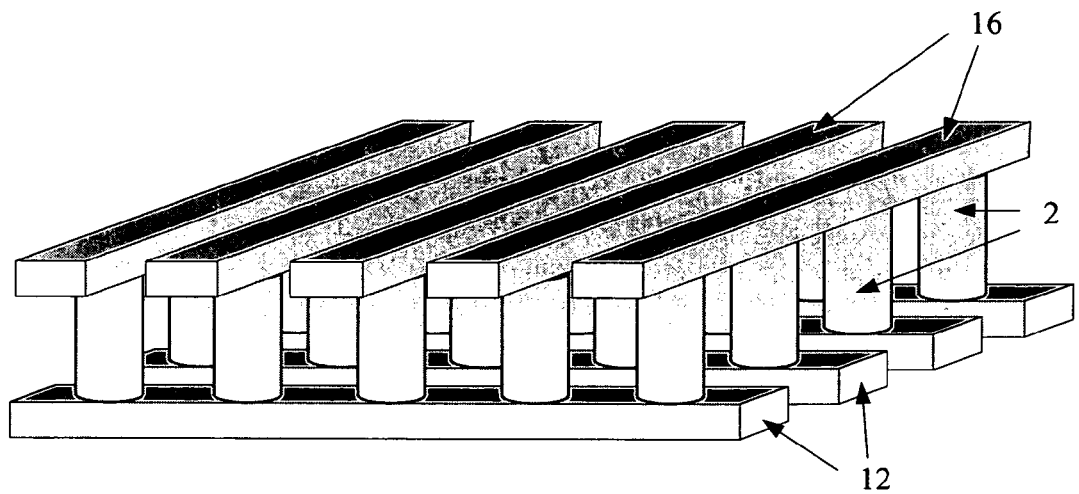
FIG. 4 is a perspective view of a first memory level of the memory cells of FIG. 1.

A plurality of memory cells like those of FIG. 1 can be formed above a suitable substrate as a first memory level, a portion of which is shown in FIG. 4, including a plurality of bottom conductors 12 and top conductors 16, with a diode 2 vertically disposed at the intersection of each bottom conductor 12 and top conductor 16 (optional dielectric rupture antifuse 14 is not shown). Two, three, four, or more such memory levels can be stacked above the substrate, each monolithically formed on the memory level beneath it.

A detailed example will be given describing formation of a first memory level of memory cells like those shown in FIG. 1, formed according to a preferred embodiment of the present invention. Additional details that may prove useful in forming this memory cell can be found in the '030 patent and the '549 and '530 applications. To avoid obscuring the invention not all of the detail from this patent and these applications will be included, but it will be understood that no teaching is intended to be excluded.

In this example, for clarity many details, including steps, materials, and process conditions, will be included. It will be understood that this example is non-limiting, and that these details can be modified, omitted, or augmented while the results fall within the scope of the invention.

Example

Figure 5A:
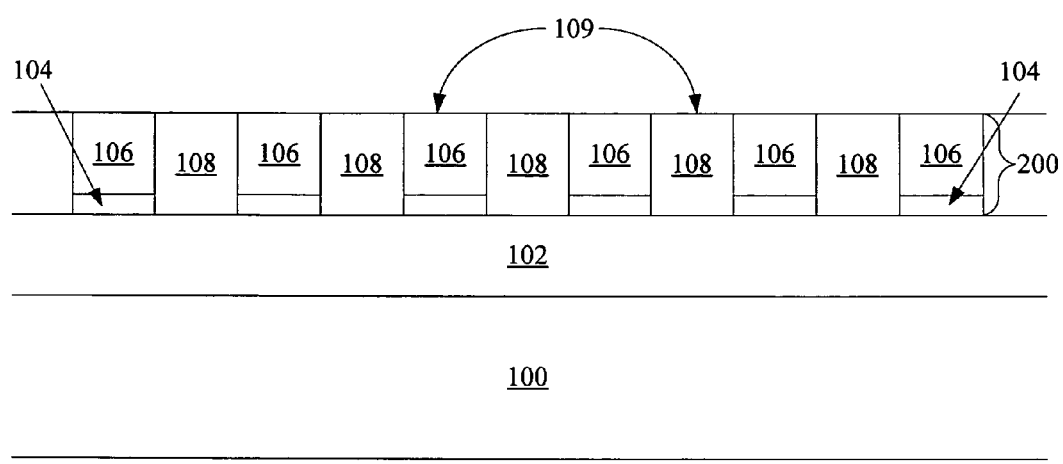
FIGS. 5a-5c are cross-sectional views illustrating stages in fabrication of a first memory level formed using aspects of the present invention.

Turning to FIG. 5a, formation of the memory begins with a substrate 100. This substrate 100 can be any semiconducting substrate as known in the art, such as monocrystalline silicon, IV-IV compounds like silicon-germanium or silicon-germanium-carbon, III-V compounds, II-VII compounds, epitaxial layers over such substrates, or any other semiconducting material. The substrate may include integrated circuits fabricated therein.

An insulating layer 102 is formed over substrate 100. The insulating layer 102 can be silicon oxide, silicon nitride, high-dielectric film, Si—C—O—H film, or any other suitable insulating material.

The first conductors 200 are formed over the substrate 100 and insulator 102. An adhesion layer 104 may be included between the insulating layer 102 and the conducting layer 106. A preferred material for the adhesion layer 104 is titanium nitride, though other materials may be used, or this layer may be omitted. Adhesion layer 104 can be deposited by any conventional method, for example by sputtering.

The next layer to be deposited is conducting layer 106. Conducting layer 106 can comprise any conducting material known in the art, such as doped semiconductor, metals such as tungsten, or conductive metal silicides; in a preferred embodiment, conducting layer 106 is tungsten.

Once all the layers that will form the conductor rails have been deposited, the layers will be patterned and etched using any suitable masking and etching process to form substantially parallel, substantially coplanar conductors 200, shown in FIG. 5a in cross-section. In one embodiment, photoresist is deposited, patterned by photolithography and the layers etched, and then the photoresist removed, using standard process techniques such as "ashing" in an oxygen-containing plasma, and strip of remaining polymers formed during etch in a conventional liquid solvent such as those formulated by EKC.

Next a dielectric material 108 is deposited over and between conductor rails 200. Dielectric material 108 can be any known electrically insulating material, such as silicon oxide, silicon nitride, or silicon oxynitride. In a preferred embodiment, silicon oxide is used as dielectric material 108. The silicon oxide can be deposited using any known process, such as chemical vapor deposition (CVD), or, for example, high-density plasma CVD (HDPCVD).

Finally, excess dielectric material 108 on top of conductor rails 200 is removed, exposing the tops of conductor rails 200 separated by dielectric material 108, and leaving a substantially planar surface 109. The resulting structure is shown in FIG. 5a. This removal of dielectric overfill to form planar surface 109 can be performed by any process known in the art, such as etchback or chemical mechanical polishing (CMP). For example, the etchback techniques described in Raghuram et al., U.S. application Ser. No. 10/883,417, "Nonselective Unpattened Etchback to Expose Buried Patterned Features," filed Jun. 30, 2004 and hereby incorporated by reference in its entirety, can advantageously be used.

Figure 5B:
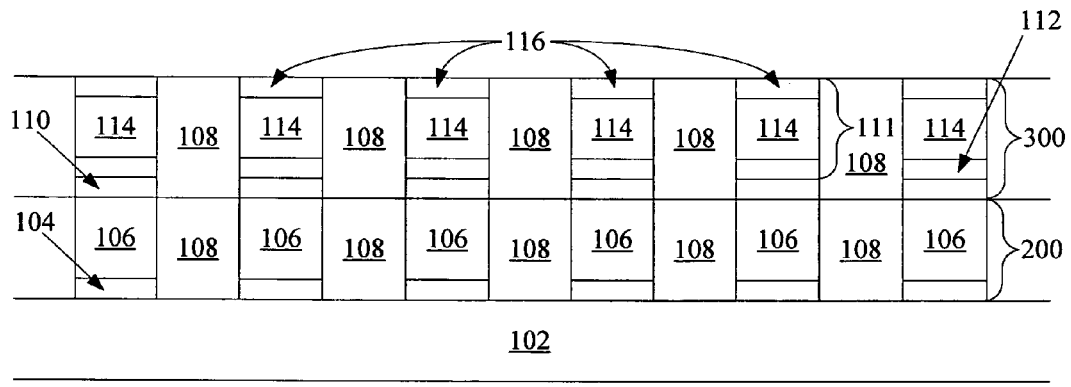

Next turning to FIG. 5b, vertically oriented diodes in the shape of pillars will be formed above completed conductor rails 200. (To save space substrate 100 is omitted in FIG. 5b and subsequent figures; its presence will be assumed.) In preferred embodiments a conductive barrier layer 110, preferably of titanium nitride, is deposited on planar surface 109. This layer may be omitted or other materials may be used, including tantalum nitride, tungsten nitride, titanium tungsten, tantalum, etc. In alternative embodiments, bottom conductors may be formed of doped polysilicon, and a conductive metal silicide such as titanium silicide, cobalt silicide, nickel silicide, etc., can be formed at this point by depositing a silicide-forming metal such as cobalt, titanium, or nickel, annealing to react the metal with the underlying silicon, forming silicide on top of conductors 200. The unreacted metal is then stripped. This example will describe the use of titanium nitride for layer 110, though it will be understood that any other appropriate conductive material can be used instead.

The surface of conductive layer 110 is next exposed to a dopant gas that will provide a p-type or an n-type dopant. In the present example, a vertically oriented p-i-n diode will be formed, having a bottom heavily doped n-type region, a middle undoped or lightly doped region, and a top heavily doped p-type region.

In the present example, then, the bottom region is to be heavily n-doped. A dopant gas that will provide an n-type dopant is flowed over the surface of conductive layer 110. The dopant gas may be, for example, $PH_3$, $POCl_3$, or $AsH_3$; if phosphorus is to be used as the dopant, for example, $PH_3$ is a preferred dopant gas. To improve mixing, $PH_3$ can be diluted in an inert gas such as helium or nitrogen. In one example 1.5 percent $PH_3$ diluted in helium is flowed at about 50 to about 80 sccm, for example at about 64 sccm, along with a flow of about 400 sccm of He, for 5-10 minutes. This flow preferably is performed at a temperature between about 350 and about 650 degrees C., and preferably between about 100 and about 1500 mTorr. These temperature, pressure, and flow rate ranges are examples only.

In an alternative embodiment the surface of conductive layer 110 could be exposed to a plasma containing $PH_3$ instead. This process, known as plasma immersion ion implantation (PIII), is usually accomplished at low pressure (typically less than 1.0 mTorr) and with a high-intensity plasma source (for example about 100 W or greater).

Exposure of the surface of layer 110 to a dopant gas (or to a plasma containing a dopant gas) is preferably followed by flowing an inert gas such as helium for, for example, five to twenty minutes. Preferably the steps of exposing layer 110 to a dopant gas, flowing an inert gas, and the upcoming deposition of semiconductor material are all performed in a single chamber without removing the substrate from the chamber between steps.

Next semiconductor material that will be patterned into pillars is deposited. The semiconductor material can be, for example, silicon, germanium, or alloys of silicon and/or germanium. The present example will describe the use of silicon, though it will be understood that other materials may be used instead.

The desired height of the diode, plus an additional thickness which will be lost in a subsequent planarization step, is deposited. For example, the thickness of deposited silicon may be between about 1400 and about 3600 angstroms, preferably about 2700 angstroms. Silicon layer 114 is preferably intrinsic silicon, or not intentionally doped.

Referring to FIG. 5*b*, during deposition some phosphorus diffuses into intrinsic silicon regions 114, forming bottom heavily doped n-type regions 112. In alternative embodiments, this diffusion may not occur during deposition, and may take place during a subsequent high-temperature step instead or as well.

Silicon regions 112 and 114, along with underlying conductive layer 110, will be patterned and etched to form pillars 300. Pillars 300 should have about the same pitch and about the same width as conductors 200 below, such that each pillar 300 is formed on top of a conductor 200. Some misalignment can be tolerated.

The pillars 300 can be formed using any suitable masking and etching process. For example, photoresist can be deposited, patterned using standard photolithography techniques, and etched, then the photoresist removed. Alternatively, a hard mask of some other material, for example silicon dioxide, can be formed on top of the semiconductor layer stack, with bottom antireflective coating (BARC) on top, then patterned and etched. Similarly, dielectric antireflective coating (DARC) can be used as a hard mask.

The photolithography techniques described in Chen, U.S. application Ser. No. 10/728,436, "Photomask Features with Interior Nonprinting Window Using Alternating Phase Shifting," filed Dec. 5, 2003; or Chen, U.S. application Ser. No. 10/815,312, Photomask Features with Chromeless Nonprinting Phase Shifting Window," filed Apr. 1, 2004, both owned by the assignee of the present invention and hereby incorporated by reference, can advantageously be used to perform any photolithography step used in formation of a memory array according to the present invention.

Dielectric material 108 is deposited over and between pillars 300, filling the gaps between them. Dielectric material 108 can be any known electrically insulating material, such as silicon dioxide.

Next the dielectric material on top of the pillars 300 is removed, exposing the tops of pillars 300 separated by dielectric material 108, and leaving a substantially planar surface. This removal of dielectric overfill and planarization can be performed by any process known in the art, such as CMP or etchback. For example, the etchback techniques described in Raghuram et al. can be used.

In preferred embodiments, heavily doped top regions 116 are formed at this point by ion implantation with a p-type dopant, for example boron or $BF_2$. The resulting structure is shown in FIG. 5*b*. The diode described herein has a bottom n-type region 112 and a top p-type region 116. If preferred, the conductivity types could be reversed. If desired, p-i-n diodes having an n-region on the bottom could be used in one memory level while p-i-n diodes having a p-type region on the bottom could be used in another memory level.

Figure 5C:
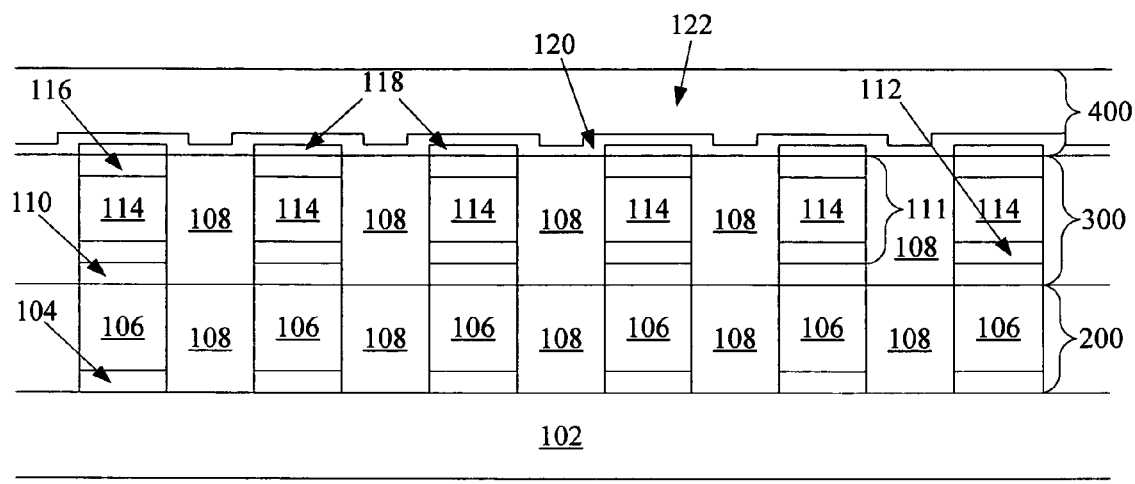

Referring to FIG. 5*c*, a dielectric rupture antifuse 118 is formed next. In preferred embodiments, antifuse 118 is a layer of a dielectric material such as silicon oxide, silicon nitride, or silicon oxynitride, preferably silicon dioxide. In some embodiments, dielectrics having a high K value, such as $Si_3N_4$ or $Al_2O_3$, may be preferred.

Next a conductive material or stack is deposited to form top conductors 400. In a preferred embodiment, titanium nitride layer 120 is deposited next, followed by tungsten layer 122. Top conductors 400 can be patterned and etched in the same manner as bottom conductors 200. Overlying second conductors 400 will preferably extend in a different direction from first conductors 200, preferably substantially perpendicular to them. Each pillar 300 should be formed at the intersection of a top conductor 400 and a bottom conductor 200. Some misalignment may be tolerated. A dielectric material (not shown) is deposited over and between conductors 400. The resulting structure, shown in FIG. 5*c*, is a bottom or first story of memory cells.

Additional memory levels can be formed above this first memory level. In some embodiments, conductors can be shared between memory levels; i.e. top conductor 400 would serve as the bottom conductor of the next memory level. In other embodiments, an interlevel dielectric is formed above the first memory level of FIG. 5*c*, its surface planarized, and construction of a second memory level begins on this planarized interlevel dielectric, with no shared conductors.

In preferred embodiments, the silicon forming the diodes was amorphous or microcrystalline as deposited. An anneal step crystallizes the silicon to polysilicon. This anneal may be done as a single step after fabrication of the memory levels is complete, or the temperatures required to grow the antifuse by thermal oxidation may be sufficient to crystallize the semiconductor material, and a separate anneal may not be required.

What has just been described is a method for forming a monolithic three dimensional memory array, the method comprising: a) monolithically forming a first memory level above a substrate, the first memory level comprising a plurality of first memory cells, the first memory level formed by a method comprising: i) forming a plurality of bottom conductors, each bottom conductor comprising a first conductive layer; ii) flowing a dopant gas over an exposed first surface of the first conductive layer, or exposing the first surface of the first conductive layer to a dopant gas, the dopant gas providing an n-type or p-type dopant; iii) depositing a layer of semiconductor material directly on the first surface; iv) patterning and etching the layer of semiconductor material to form a first plurality of pillars; and v) forming a plurality of second conductors, the second conductors above the first pillars, wherein the memory cell comprises a portion of the first conductor, the first pillar, and a portion of the second conductor; and b) monolithically forming a second memory level above the first memory level.

A monolithic three dimensional memory array is one in which multiple memory levels are formed above a single substrate, such as a wafer, with no intervening substrates. The layers forming one memory level are deposited or grown directly over the layers of an existing level or levels. In contrast, stacked memories have been constructed by forming memory levels on separate substrates and adhering the memory levels atop each other, as in Leedy, U.S. Pat. No. 5,915,167, "Three dimensional structure memory." The substrates may be thinned or removed from the memory levels before bonding, but as the memory levels are initially formed over separate substrates, such memories are not true monolithic three dimensional memory arrays.

A monolithic three dimensional memory array formed above a substrate comprises at least a first memory level formed at a first height above the substrate and a second memory level formed at a second height different from the first height. Three, four, eight, or indeed any number of memory levels can be formed above the substrate in such a multilevel array.

As described, the methods of the present invention can be used to form a vertically oriented p-i-n diode. As will be appreciated by those skilled in the art, methods of the present invention can be used to form other devices as well. One example is a MOSFET having a vertically oriented channel.

Petti et al., U.S. patent application Ser. No. 11/143,269, "Rewriteable Memory Cell Comprising a Transistor and Resistance-Switching Material in Series," filed Jun. 2, 2005, assigned to the assignee of the present invention and hereby incorporated by reference, describe a memory cell having a layer of a resistivity-switching binary metal oxide or nitride formed in series with a field-effect transistor. In embodiments of Petti et al., the field-effect transistor is a thin-film transistor (TFT), having its channel region in deposited semiconductor material rather than in a monocrystalline wafer substrate.

Figure 6A:
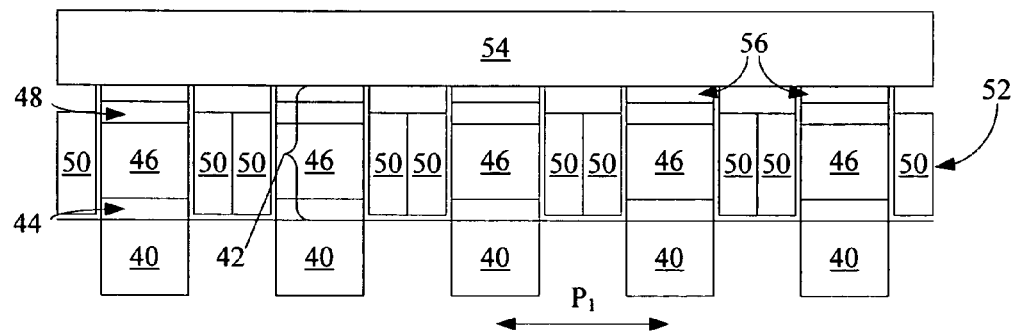
FIG. 6a is a cross-sectional view of memory cells formed according to an alternative embodiment of the present invention.

Turning to FIG. 6a, in a preferred embodiment of Petti et al. a plurality of substantially parallel data lines 40 is formed. Semiconductor pillars 42 are formed, each above one of the data lines 40. Each pillar 42 includes heavily doped regions 44 and 48 which serve as drain and source regions, and a lightly doped region 46 which serves as a channel region. A gate electrode 50 surrounds each pillar 42.

Figure 6B:
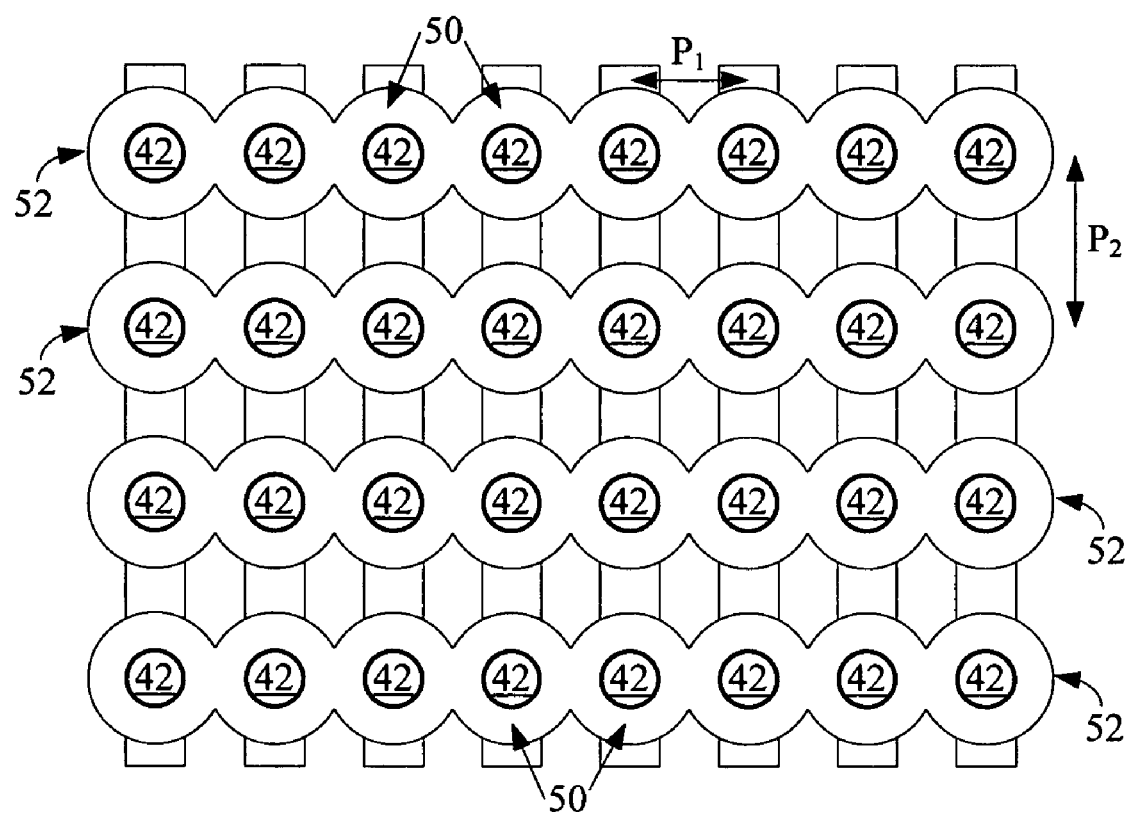
FIG. 6b is a plan view of these memory cells.

FIG. 6b shows the cells of FIG. 6a viewed from above. In a repeating pattern, pitch is the distance between a feature and the next occurrence of the same feature. For example, the pitch of pillars 42 is the distance between the center of one pillar and the center of the adjacent pillar. In one direction pillars 42 have a first pitch $P_1$, while in other direction, pillars 12 have a larger pitch $P_2$; for example $P_2$ may be 1.5 times larger than $P_1$. In the direction having the smaller pitch $P_1$, shown in FIG. 6a, the gate electrodes 20 of adjacent memory cells merge, forming a single select line 52. In the direction having larger pitch $P_2$, gate electrodes 50 of adjacent cells do not merge, and adjacent select lines 52 are isolated.

Bottom heavily doped regions 44 can be formed using methods of the present invention, as can such a region in any other TFT having a vertically oriented channel region.

The examples provided herein have included monolithic three dimensional memory arrays, but those skilled in the art will appreciate that the methods of the present invention can be used in any context when deposited semiconductor material is to form an ohmic contact to underlying conductive material.

Detailed methods of fabrication have been described herein, but any other methods that form the same structures can be used while the results fall within the scope of the invention.

The foregoing detailed description has described only a few of the many forms that this invention can take. For this reason, this detailed description is intended by way of illustration, and not by way of limitation. It is only the following claims, including all equivalents, which are intended to define the scope of this invention.

What is claimed is:

1. A method for forming a contact to semiconductor material, the method comprising:
   either a) flowing a dopant gas over an exposed surface of a first conductive layer or b) exposing the first conductive layer to a plasma containing the dopant gas, wherein the dopant gas provides an n-type or p-type dopant;
   depositing the semiconductor material immediately on the surface of the first conductive layer, wherein the semiconductor material and the first conductive layer form a portion of an integrated circuit, and wherein the n-type or p-type dopant forms a substantially ohmic contact between the semiconductor material and the first conductive layer; and
   after the flowing or exposing step, and before the depositing step, flowing an inert gas for at least one minute.

2. The method of claim 1 wherein the n-type dopant or p-type dopant is phosphorus, boron, arsenic, indium, gallium, or aluminum.

3. The method of claim 1 wherein the dopant gas is $PH_3$, $POd_3$, $BCl_3$, $B_2H_6$, $AsH_3$, $GaCl$, $GaCl_3$, $Ga(CH_3)_3$, $Al(CH_3)_3$, or $In(H_3)_3$.

4. The method of claim 1 wherein the first conductive layer is titanium nitride, tantalum nitride, tungsten nitride, tungsten, tantalum, titanium tungsten, or a conductive metal silicide.

5. The method of claim 4 wherein the first conductive metal silicide is titanium silicide, cobalt silicide, nickel silicide, or tungsten silicide.

6. The method of claim 4 wherein the first conductive layer is titanium nitride.

7. The method of claim 1 wherein the semiconductor material is silicon, germanium, or an alloy of silicon and/or germanium.

8. The method of claim 7 wherein the semiconductor material is amorphous, microcrystalline, or polycrystalline.

9. The method of claim 1 wherein, during the step of depositing the semiconductor material, no dopant gas providing n-type or p-type dopant is present.

10. The method of claim 9 wherein some of the p-type or n-type dopant provided by the dopant gas diffuses into the semiconductor material, forming a bottom heavily doped region.

11. The method of claim 10 wherein the top of the bottom heavily doped region defines a pn junction.

12. The method of claim 10 further comprising patterning and etching the semiconductor material to form a semiconductor pillar.

13. The method of claim 12 wherein a bottom conductor comprises the first conductive layer.

14. The method of claim 13 further comprising forming a top heavily doped region at the top of the pillar.

15. The method of claim 14 wherein the bottom heavily doped region has a first conductivity type, and wherein the top heavily doped region has a second conductivity type opposite the first conductivity type.

16. The method of claim 15 wherein the first conductivity type is n-type.

17. The method of claim 14 further comprising forming a top conductor above the pillar, wherein a memory cell comprises a portion of the bottom conductor, a portion of the top conductor, and the pillar.

18. The method of claim 17 wherein the pillar comprises a vertically oriented diode.

19. The method of claim 18 wherein the diode is a pin diode.

20. The method of claim 17 wherein the memory cell comprises a field-effect transistor, wherein the pillar comprises a vertically oriented channel region of the field-effect transistor.

21. A method for forming a memory cell, the method comprising:
    forming a first conductor, the first conductor comprising a first conductive layer;
    either a) flowing a dopant gas over an exposed first surface of the first conductive layer or b) exposing the exposed first surface of the first conductive layer to a plasma containing a dopant gas, wherein the dopant gas provides an n-type or p-type dopant;
    depositing a layer of semiconductor material directly on the first surface;
    after the flowing or exposing step, and before the depositing step, flowing an inert gas for at least one minute;
    patterning and etching the layer of semiconductor material to form a pillar; and
    forming a second conductor, the second conductor above the pillar, wherein the memory cell comprises a portion of the first conductor, the pillar, and a portion of the second conductor, wherein some of the n-type or p-type dopant diffuses into the layer of semiconductor material, forming a substantially ohmic contact between the semiconductor material and the first conductor.

22. The method of claim 21 wherein the n-type dopant or p-type dopant is phosphorus, boron, arsenic, indium, gallium, or aluminum.

23. The method of claim 21 wherein the dopant gas is $PH_3$, $POd_3$, $BCl_3$, $B_2H_6$, $AsH_3$, $GaCl$, $GaCl_3$, $Ga(CH_3)_3$, $Al(CH_3)_3$, or $In(H_3)_3$.

24. The method of claim 21 wherein the first conductive layer is titanium nitride, tantalum nitride, tungsten nitride, tungsten, tantalum, titanium tungsten, or a conductive metal silicide.

25. The method of claim 24 wherein the first conductive layer is titanium nitride.

26. The method of claim 21 wherein the semiconductor material is silicon, germanium, or silicon germanium.

27. The method of claim 26 wherein the semiconductor material is polycrystalline, microcrystalline, or amorphous.

28. The method of claim 21 wherein some of the p-type or n-type dopant diffuses into the layer of semiconductor material, forming a bottom heavily doped region.

29. The method of claim 28 further comprising forming a top heavily doped region at the top of the pillar.

30. The method of claim 29 wherein the bottom heavily doped region has a first conductivity type, and wherein the top heavily doped region has a second conductivity type opposite the first conductivity type.

31. The method of claim 30 wherein the pillar comprises a vertically oriented diode.

32. The method of claim 31 wherein the vertically oriented diode is a pin diode.

33. The method of claim 30 wherein the memory cell comprises a field effect transistor, the pillar comprising a vertical channel region of the field effect transistor.

34. A method for forming a monolithic three dimensional memory array, the method comprising:
    a) monolithically forming a first memory level above a substrate, the first memory level comprising a plurality of first memory cells, the first memory level formed by a method comprising:
        i) forming a plurality of bottom conductors, each bottom conductor comprising a first conductive layer;
        ii) flowing a dopant gas over an exposed first surface of the first conductive layer, or exposing the first surface of the first conductive layer to a dopant gas, the dopant gas providing an n-type or p-type dopant;
        iii) depositing a layer of semiconductor material directly on the first surface;
        iv) after the flowing or exposing step, and before the depositing step, flowing an inert gas for at least one minute;
        v) patterning and etching the layer of semiconductor material to form a first plurality of pillars; and
        vi) forming a plurality of second conductors, the second conductors above the first pillars, wherein the memory cell comprises a portion of the first conductor, the first pillar, and a portion of the second conductor; and
    b) monolithically forming a second memory level above the first memory level.

35. The method of claim 34 wherein the n-type dopant or p-type dopant is phosphorus, boron, arsenic, indium, gallium, or aluminum.

36. The method of claim 34 wherein the dopant gas is $PH_3$, $POd_3$, $BCl_3$, $B_2H_6$, $AsH_3$, $GaCl$, $GaCl_3$, $Ga(CH_3)_3$, $Al(CH_3)_3$, or $In(H_3)_3$.

37. The method of claim 34 wherein the first conductive layer is titanium nitride, tantalum nitride, tungsten nitride, tungsten, tantalum, titanium tungsten, or a conductive metal silicide.

38. The method of claim 37 wherein the first conductive layer is titanium nitride.

39. The method of claim 34 wherein the semiconductor material is silicon, germanium, or silicon germanium.

40. The method of claim 39 wherein the semiconductor material is polycrystalline, microcrystalline, or amorphous.

41. The method of claim 34 wherein some of the p-type or n-type dopant provided by the dopant gas diffuses into the layer of semiconductor material, forming a bottom heavily doped region of each first pillar.

42. The method of claim 41 further comprising forming a top heavily doped region at the top of each first pillar.

43. The method of claim 42 wherein the bottom heavily doped region of each first pillar has a first conductivity type, and wherein the top heavily doped region of each first pillar has a second conductivity type opposite the first conductivity type.

44. The method of claim 43 wherein each first pillar comprises a vertically oriented diode.

45. The method of claim 44 wherein each vertically oriented diode is a pin diode.

46. The method of claim 43 wherein each first memory cell comprises a field effect transistor, each first pillar comprising a vertical channel region of one of the field effect transistors.

47. A method for forming a contact to semiconductor material, the method comprising:
   either: a) flowing a dopant gas over an exposed surface of a first conductive layer or b) exposing the first conductive layer to a plasma containing the dopant gas, wherein the dopant gas provides an n-type or p-type dopant, wherein the first conductive layer is titanium silicide, cobalt silicide, nickel silicide, or tungsten silicide; and
   depositing the semiconductor material on the surface of the first conductive layer, wherein the semiconductor material and the first conductive layer form a portion of an integrated circuit, and wherein the n-type or p-type dopant forms a substantially ohmic contact between the semiconductor material and the first conductive layer.

48. A method for forming a memory cell, the method comprising:
   forming a first conductor, the first conductor comprising a first conductive layer, wherein the first conductive layer is titanium silicide, cobalt silicide, nickel silicide, or tungsten silicide;
   either a) flowing a dopant gas over an exposed first surface of the first conductive layer or b) exposing the exposed first surface of the first conductive layer to a plasma containing a dopant gas, wherein the dopant gas provides an n-type or p-type dopant;
   depositing a layer of semiconductor material directly on the first surface;
   patterning and etching the layer of semiconductor material to form a pillar; and
   forming a second conductor, the second conductor above the pillar, wherein the memory cell comprises a portion of the first conductor, the pillar, and a portion of the second conductor, wherein some of the n-type or p-type dopant diffuses into the layer of semiconductor material, forming a substantially ohmic contact between the semiconductor material and the first conductor.

49. A method for forming a monolithic three dimensional memory array, the method comprising:
   a) monolithically forming a first memory level above a substrate, the first memory level comprising a plurality of first memory cells, the first memory level formed by a method comprising:
      i) forming a plurality of bottom conductors, each bottom conductor comprising a first conductive layer, wherein the first conductive layer is titanium silicide, cobalt silicide, nickel silicide, or tungsten silicide;
      ii) flowing a dopant gas over an exposed first surface of the first conductive layer, or exposing the first surface of the first conductive layer to a dopant gas, the dopant gas providing an n-type or p-type dopant;
      iii) depositing a layer of semiconductor material directly on the first surface;
      iv) patterning and etching the layer of semiconductor material to form a first plurality of pillars; and
      v) forming a plurality of second conductors, the second conductors above the first pillars, wherein the memory cell comprises a portion of the first conductor, the first pillar, and a portion of the second conductor; and
   b) monolithically forming a second memory level above the first memory level.

* * * * *

UNITED STATES PATENT AND TRADEMARK OFFICE
CERTIFICATE OF CORRECTION

PATENT NO. : 7,754,605 B2 Page 1 of 1
APPLICATION NO. : 11/478706
DATED : July 13, 2010
INVENTOR(S) : S. Brad Herner It is certified that error appears in the above-identified patent and that said Letters Patent is hereby corrected as shown below:

Column 10, line 49, "POd3," should be changed to "POCl3,"

Column 11, line 26, "The method of claim 18 wherein the diode is a pin" should be changed to "The method of claim 18 wherein the diode is a p-i-n"

Column 11, line 58, "POd3," should be changed to "POCl3,"

Column 12, line 15, "diode is a pin diode." should be changed to "diode is a p-i-n diode."

Column 12, line 50, "POd3," should be changed to "POCl3,"

Column 13, line 9, "ented diode is a pin diode." should be changed to "ented diode is a p-i-n diode."

Signed and Sealed this

Twenty-eighth Day of September, 2010

David J. Kappos
*Director of the United States Patent and Trademark Office*